United States Patent
Beaston

(10) Patent No.: US 10,153,521 B2
(45) Date of Patent: Dec. 11, 2018

(54) SYSTEMS AND METHODS FOR DETECTING A BATTERY PACK HAVING AN OPERATING ISSUE OR DEFECT

(71) Applicant: Powin Energy Corporation, Tualatin, OR (US)

(72) Inventor: Virgil Lee Beaston, Tualatin, OR (US)

(73) Assignee: Powin Energy Corporation, Tualatin, OR (US)

( * ) Notice: Subject to any disclaimer, the term of this patent is extended or adjusted under 35 U.S.C. 154(b) by 494 days.

(21) Appl. No.: 14/819,774

(22) Filed: Aug. 6, 2015

(65) Prior Publication Data

US 2017/0040646 A1 Feb. 9, 2017

(51) Int. Cl.
*H01M 10/42* (2006.01)
*H02J 7/00* (2006.01)
(Continued)

(52) U.S. Cl.
CPC ...... *H01M 10/425* (2013.01); *G01R 31/3682* (2013.01); *G06F 11/079* (2013.01); *G06F 11/0736* (2013.01); *G06F 11/0757* (2013.01); *H02J 7/0014* (2013.01); *H02J 7/0021* (2013.01); *H02J 7/0026* (2013.01); *H01M 2010/4271* (2013.01)

(58) Field of Classification Search
CPC ........ H01M 10/425; H01M 2010/4271; G06F 11/079; G06F 11/0736; G06F 11/0757; H02J 7/0026; H02J 7/0014; G01R 31/3682
USPC .......................................................... 429/61
See application file for complete search history.

(56) References Cited

U.S. PATENT DOCUMENTS 5,047,961 A 9/1991 Simonsen
5,825,155 A 10/1998 Ito et al.
(Continued)

FOREIGN PATENT DOCUMENTS

CN 1367565 A 9/2002
CN 2648617 Y 10/2004
(Continued)

OTHER PUBLICATIONS

Non-Final Office Action dated Dec. 29, 2016 in U.S. Appl. No. 14/678,074, filed Apr. 3, 2015; 16 pages.
(Continued)

*Primary Examiner* — Gary D Harris
(74) *Attorney, Agent, or Firm* — Sterne, Kessler, Goldstein & Fox P.L.L.C.

(57) ABSTRACT

Systems and methods are disclosed for detecting a battery pack having an operating issue or defect. In an embodiment, a balancing charger may be configured to charge a battery pack. An amount of time that the balancing charger is operating may be recorded. The recorded time may then be compared to a threshold time that indicates a determined variance from an expected operating time. If the recorded time exceeds the threshold time, the battery pack may be determined to have an operating issue or defect. In an embodiment, the threshold time may be adjusted based on an average battery cell or battery module temperature of the battery pack. In various embodiments, an alert may also be issued in response to determining that the battery pack has an operating issue or defect and operation of the battery pack may be halted to prevent any potential adverse effects.

18 Claims, 12 Drawing Sheets

(51) Int. Cl.
  *G01R 31/36* (2006.01)
  *G06F 11/07* (2006.01)

(56) References Cited

U.S. PATENT DOCUMENTS

| | | |
|---|---|---|
| 5,952,815 A | 9/1999 | Rouillard et al. |
| 6,051,976 A | 4/2000 | Bertness |
| 6,060,864 A | 5/2000 | Ito et al. |
| 6,172,481 B1 | 1/2001 | Curtiss |
| 6,184,656 B1 | 2/2001 | Karunasiri et al. |
| 7,497,285 B1 | 3/2009 | Radev |
| 7,583,053 B2 | 9/2009 | Kamohara |
| 8,111,035 B2 | 2/2012 | Rosenstock |
| 9,168,836 B2 | 10/2015 | Jacobsen |
| 9,331,497 B2 | 5/2016 | Beaston |
| 9,647,463 B2 | 5/2017 | Brandl et al. |
| 9,847,654 B2 | 12/2017 | Beaston |
| 2002/0193955 A1 | 12/2002 | Bertness et al. |
| 2004/0130292 A1 | 7/2004 | Buchanan et al. |
| 2004/0189248 A1 | 9/2004 | Boskovitch et al. |
| 2005/0024016 A1 | 2/2005 | Breen et al. |
| 2005/0230976 A1 | 10/2005 | Yang |
| 2006/0038572 A1 | 2/2006 | Philbrook |
| 2006/0097698 A1 | 5/2006 | Plett |
| 2006/0116797 A1 | 6/2006 | Moran |
| 2006/0261780 A1 | 11/2006 | Edington et al. |
| 2007/0124037 A1 | 5/2007 | Moran |
| 2007/0191180 A1 | 8/2007 | Yang |
| 2007/0229032 A1 | 10/2007 | Elder et al. |
| 2008/0093851 A1 | 4/2008 | Maeda et al. |
| 2008/0211459 A1 | 9/2008 | Choi |
| 2008/0238356 A1 | 10/2008 | Batson et al. |
| 2008/0309288 A1 | 12/2008 | Benckenstein et al. |
| 2009/0015206 A1 | 1/2009 | Seman, Jr. et al. |
| 2009/0167247 A1 | 7/2009 | Bai et al. |
| 2009/0222158 A1 | 9/2009 | Kubota et al. |
| 2009/0243540 A1 | 10/2009 | Choi et al. |
| 2010/0076706 A1 | 3/2010 | Elder et al. |
| 2010/0145562 A1 | 6/2010 | Moran |
| 2010/0237829 A1 | 9/2010 | Tatebayashi et al. |
| 2010/0248008 A1 | 9/2010 | Sugawara et al. |
| 2011/0014501 A1 | 1/2011 | Scheucher |
| 2011/0133920 A1 | 6/2011 | Meadors |
| 2011/0137502 A1 | 6/2011 | Kato et al. |
| 2011/0231049 A1 | 9/2011 | Le Brusq et al. |
| 2011/0244283 A1 | 10/2011 | Seto et al. |
| 2011/0258126 A1 | 10/2011 | Patil et al. |
| 2011/0313613 A1 | 12/2011 | Kawahara et al. |
| 2012/0046892 A1 | 2/2012 | Fink |
| 2012/0062187 A1 | 3/2012 | Shim |
| 2012/0068715 A1 | 3/2012 | Martaeng |
| 2012/0074911 A1 | 3/2012 | Murao |
| 2012/0089352 A1 | 4/2012 | Librizzi |
| 2012/0105001 A1 | 5/2012 | Gallegos et al. |
| 2012/0303225 A1 | 11/2012 | Futahashi et al. |
| 2013/0002197 A1 | 1/2013 | Hernandez et al. |
| 2013/0002203 A1 | 1/2013 | Kuraishi |
| 2013/0065093 A1* | 3/2013 | White .......... H01M 10/42 429/50 |
| 2013/0106356 A1 | 5/2013 | Nakao et al. |
| 2013/0135110 A1 | 5/2013 | Xie et al. |
| 2013/0328530 A1 | 12/2013 | Beaston |
| 2013/0337299 A1 | 12/2013 | Sugawara |
| 2014/0015469 A1 | 1/2014 | Beaston et al. |
| 2014/0015488 A1 | 1/2014 | Despesse |
| 2014/0042973 A1 | 2/2014 | Kawahara et al. |
| 2014/0079963 A1 | 3/2014 | Takeuchi |
| 2014/0123310 A1 | 5/2014 | Cherry et al. |
| 2014/0220396 A1 | 8/2014 | Lee et al. |
| 2014/0225622 A1 | 8/2014 | Kudo et al. |
| 2014/0312828 A1 | 10/2014 | Vo et al. |
| 2015/0104673 A1 | 4/2015 | de Greef et al. |
| 2015/0202973 A1 | 7/2015 | Chang |
| 2015/0349569 A1 | 12/2015 | Christensen et al. |
| 2016/0111900 A1 | 4/2016 | Beaston et al. |
| 2016/0141894 A1 | 5/2016 | Beaston |
| 2017/0038433 A1 | 2/2017 | Beaston et al. |
| 2017/0077558 A1 | 3/2017 | Nystrom et al. |
| 2017/0077559 A1 | 3/2017 | Beaston |
| 2017/0106764 A1 | 4/2017 | Beaston et al. |
| 2017/0126032 A1 | 5/2017 | Beaston |
| 2017/0345101 A1 | 11/2017 | Beaston |
| 2018/0123357 A1 | 5/2018 | Beaston et al. |
| 2018/0181967 A1 | 6/2018 | Beaston et al. |

FOREIGN PATENT DOCUMENTS

| | | |
|---|---|---|
| CN | 2796215 Y | 7/2006 |
| CN | 1819395 A | 8/2006 |
| CN | 1011992755 A | 6/2008 |
| CN | 101222150 A | 7/2008 |
| CN | 102570568 A | 7/2012 |
| CN | 102882263 A | 1/2013 |
| CN | 202663154 U | 1/2013 |
| CN | 103119828 A | 5/2013 |
| CN | 103253143 A | 8/2013 |
| CN | 103812150 A | 5/2014 |
| WO | WO 2012/110497 A1 | 8/2012 |

OTHER PUBLICATIONS

U.S. Appl. No. 15/389,188, "Battery Pack Monitoring and Warranty System," to Beaston et al., filed Dec. 22, 2016.
Non-Final Office Action dated May 12, 2015, in U.S. Appl. No. 13/978,689, filed Aug. 27, 2013; 12 pages.
Final Office Action dated Sep. 21, 2015, in U.S. Appl. No. 13/978,689, filed Aug. 27, 2013; 12 pages.
Non-Final Office Action dated Nov. 23, 2015, in U.S. Appl. No. 13/978,689, filed Aug. 27, 2013; 11 pages.
Notice of Allowance dated Mar. 21, 2016, in U.S. Appl. No. 13/978,689, filed Aug. 27, 2013; 8 pages.
International Preliminary Report on Patentability, dated Sep. 10, 2013, in International Patent Application No. PCT/CN2011/071548; 5 pages.
International Search Report and Written Opinion on Patentability, dated Dec. 1, 2011, in International Patent Application No. PCT/CN2011/071548; 10 pages.
U.S. Appl. No. 14/678,074, "Electrical Energy Storage Unit and Control System and Applications Thereof," to Beaston, et al., filed Apr. 3, 2015.
U.S. Appl. No. 14/851,460, "Battery Management System (BMS) Having Isolated, Distributed, Daisy-Chained Battery Module Controllers," to Nystrom, et al., filed. Sep. 11, 2015.
U.S. Appl. No. 14/851,482, "Battery Pack with Integrated Battery Management System," to Beaston, et al., filed Sep. 11, 2015.
U.S. Appl. No. 14/932,688, "Battery Energy Storage System," to Beaston, filed Nov. 4, 2015.
U.S. Appl. No. 14/962,491, "Battery Energy Storage System and Control System and Applications Thereof," to Beaston, filed Dec. 8, 2015.
U.S. Appl. No. 14/819,779, "Warranty Tracker for a Battery Pack," to Beaston, filed Aug. 6, 2015.
U.S. Appl. No. 14/884,463, "Battery-Assisted Electric Vehicle Charging System and Method," to Beaston et al., filed Oct. 15, 2015.
U.S. Appl. No. 15/604,329, "World-Wide Web of Networked, Smart, Scalable, Plug & Play Battery Packs Having a Battery Pack Operating System, and Applications Thereof," to Beaston, filed May 24, 2017.
https://www.merriam-webster.com/dictionary/daisy%20chain.
Chris Bakken and Ives Meadors, applicants; U.S. Appl. No. 61/313,548; publicly available as of Jun. 9, 2011 (filed Mar. 12, 2010); 14 pages including filing receipt, provisional cover sheet, and EFS receipt.
English language abstract of Chinese Patent Publication No. CN 101222150 A, published Jul. 16, 2008, 1 page, retrieved from https://worldwide.espacenet.com.
English language abstract of Chinese Patent Publication No. CN 102570568 A, published Jul. 11, 2012, 1 page, retrieved from https://worldwide.espacenet.com.

(56) References Cited

OTHER PUBLICATIONS

English language abstract of Chinese Patent Publication No. CN 102882263 A, published Jan. 16, 2013, 1 page, retrieved from https://worldwide.espacenet.com.
English language abstract of Chinese Patent Publication No. CN 103253143 A, published Aug. 21, 2013, 1 page, retrieved from https://worldwide.espacenet.com.
English language abstract of Chinese Patent Publication No. CN 202663154 U, published Jan. 9, 2013, 1 page, retrieved from https://worldwide.espacenet.com.
English translation for Chinese patent publication No. CN 103119828 A, published May 22, 2013, 13 pages, translated by Google Patents at https://patents.google.com.
English translation for Chinese patent publication No. CN 103812150 A, published May 21, 2014, 7 pages, translated by Google Patents at https://patents.google.com.
"bq78412 Pb-Acid Battery State-of-Charge Indicator With Run-Time Display," Texas Instruments SLUAA0—Oct. 2010, 37 pages.

\* cited by examiner

SYSTEMS AND METHODS FOR DETECTING A BATTERY PACK HAVING AN OPERATING ISSUE OR DEFECT

BACKGROUND

Field

Embodiments of the systems and methods described herein are generally related to detection of battery packs having an operating issue or defect.

Background

An undetected issue or defect in a large, multi-cell battery pack may lead to electrical damage or fire. Typically, a battery pack may be examined only after a failure or during routine service, which may be infrequent. However, an issue or defect may exist even though the battery pack appears to be functioning properly. If the battery pack is part of a larger array of batteries, the array may appear to function properly even when an issue or defect exists in one battery pack, and detecting an issue or defect becomes increasingly difficult.

SUMMARY

Systems and methods are disclosed for detecting a battery pack having an operating issue or defect. In an embodiment, a balancing charger may be configured to charge a battery pack. An amount of time that the balancing charger is operating may be recorded. The recorded time may then be compared to a threshold time that indicates a determined variance from an expected operating time. If the recorded time exceeds the threshold time, the battery pack may be determined to have an operating issue or defect. In an embodiment, the threshold time may be adjusted based on an average battery cell or battery module temperature of the battery pack.

In an embodiment, a warning or an alert may be issued in response to determining that the battery pack has an operating issue or defect. Operation of the battery pack determined to have an operating issue or defect may also be halted to prevent any adverse effects.

Further embodiments, features, and advantages of the invention, as well as the structure and operation of the various embodiments, are described in detail below with reference to accompanying drawings.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art to make and use the disclosure.

The drawing in which an element first appears is typically indicated by the leftmost digit or digits in the corresponding reference number. In the drawings, like reference numbers may indicate identical or functionally similar elements.

DETAILED DESCRIPTION

While the present disclosure is described herein with illustrative embodiments for particular applications, it should be understood that the disclosure is not limited thereto. A person skilled in the art with access to the teachings provided herein will recognize additional modifications, applications, and embodiments within the scope thereof and additional fields in which the disclosure would be of significant utility.

The terms "embodiments" or "example embodiments" do not require that all embodiments include the discussed feature, advantage, or mode of operation. Alternate embodiments may be devised without departing from the scope or spirit of the disclosure, and well-known elements may not be described in detail or may be omitted so as not to obscure the relevant details. In addition, the terminology used herein is for the purpose of describing particular embodiments only and is not intended to be limiting. For example, as used herein, the singular forms "a," "an" and "the" are intended to include the plural forms as well, unless the context clearly indicates otherwise. It will be further understood that the terms "comprises," "comprising," "includes" and "including," when used herein, specify the presence of stated features, integers, steps, operations, elements, and components, but do not preclude the presence or addition of one or more other features, integers, steps, operations, elements, components, or groups thereof.

Figure 1A:
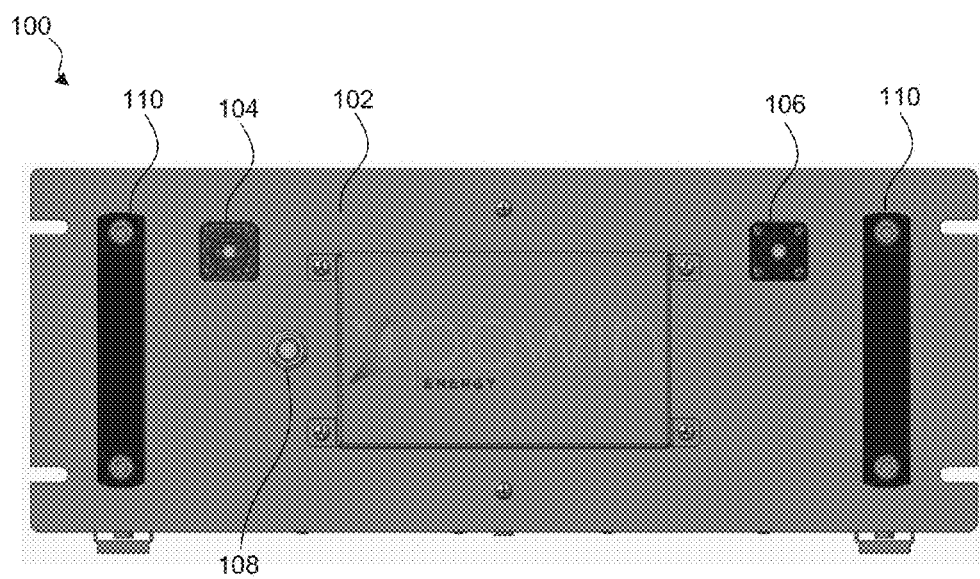
FIGS. 1A, 1B, and 1C are diagrams illustrating an example battery pack.
Figure 1B:
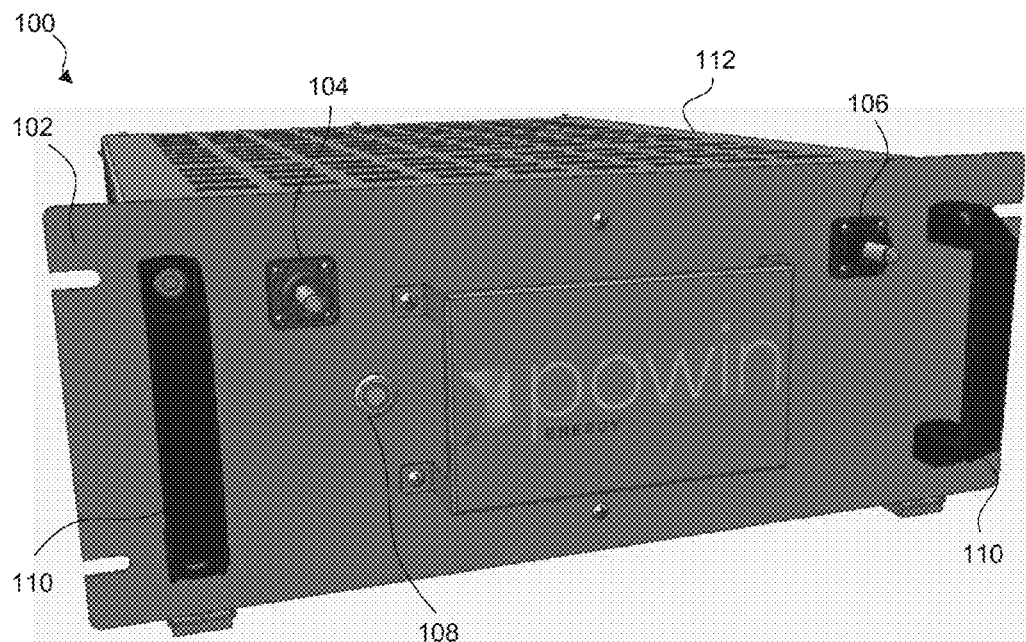
Figure 1C:
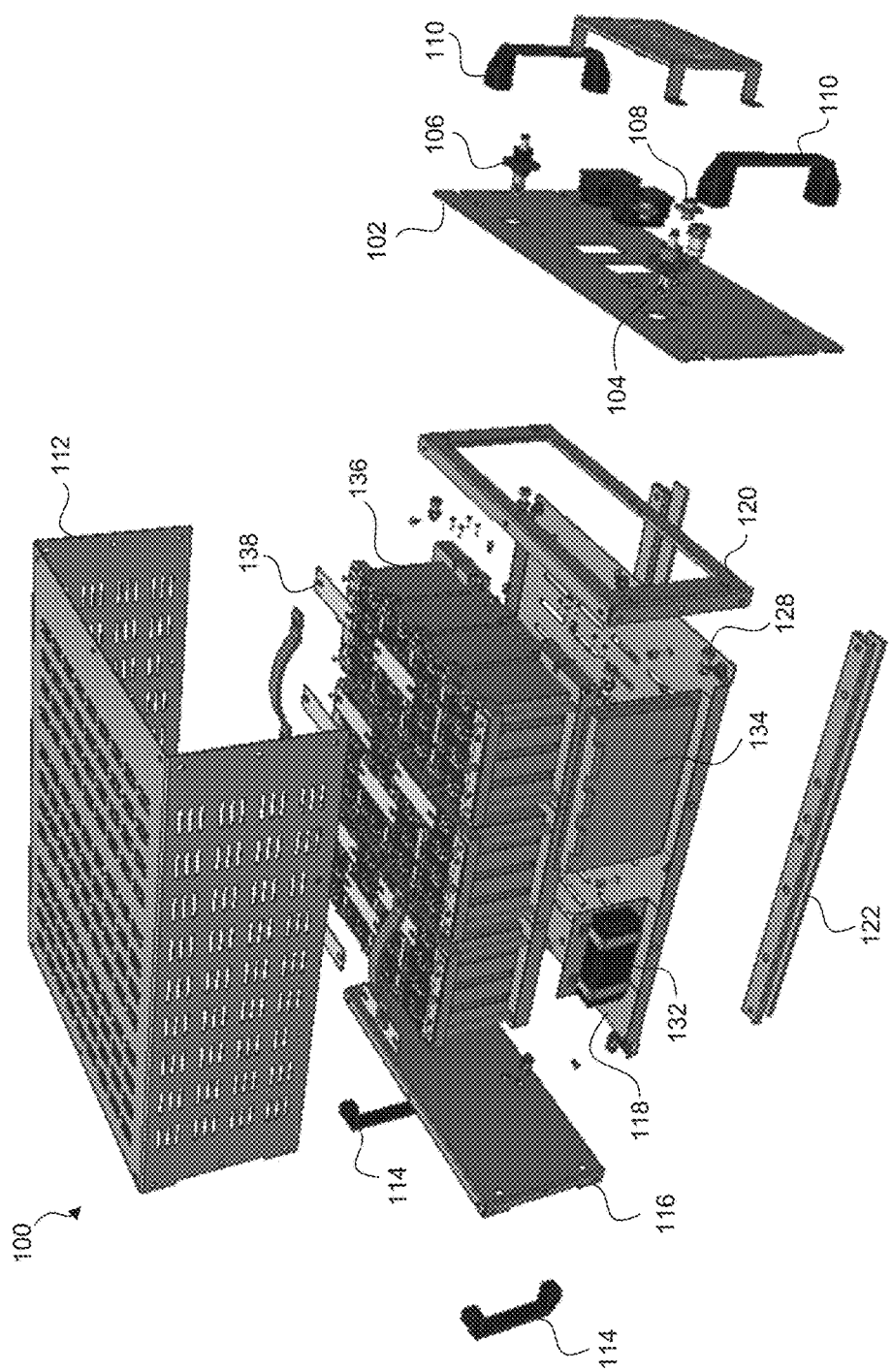

FIGS. 1A, 1B, and 1C are diagrams that illustrate an example battery pack 100 according to an embodiment of the disclosure. Specifically, FIGS. 1A and 1B depict front views of battery pack 100, and FIG. 1C depicts an exploded view of battery pack 100. As shown in FIGS. 1A-C, the housing of battery pack 100 may include a front panel 102, a lid or cover 112, a back panel 116, and a bottom 118. The lid 112, which includes left and right side portions, may include a plurality of air vents to facilitate air flow through battery pack 100 and aid in cooling the internal components of battery pack 100. In a non-limiting embodiment, the lid 112 is "U"-shaped and may be fabricated from a single piece of metal, plastic, or any other material known to one of ordinary skill in the art.

The housing of battery pack 100 may be assembled using fasteners 128 shown in FIG. 1C, which may be screws and bolts or any other fastener known to one of ordinary skill in the art. The housing of battery pack 100 may also include front handles 110 and back handles 114. As shown in FIG. 1C, front plate 102 may be coupled to lid 112 and bottom 118 via front panel mount 120. In one embodiment, battery pack 100 is implemented as a rack-mountable equipment module. For example, battery pack 100 may be implemented as a standard 19-inch rack (e.g., front panel 102 having a width of 19 inches, and battery pack 100 having a depth of between 22 and 24 inches and a height of 4 rack units or "U," where U is a standard unit that is equal to 1.752 inches). As shown in FIG. 1C, battery pack 100 may include one or more mounts 122 attached to bottom 118. Mount 122 may be used to secure battery pack 100 in a rack in order to arrange a plurality of battery packs in a stacked configuration (shown in FIG. 5).

In FIGS. 1A-C, battery pack 100 includes a power connector 104 for connecting to the negative terminal of the battery pack and a power connector 106 for connecting to a positive terminal of the battery pack. As shown in FIGS. 1A and 1B, the power connectors 104 and 106 may be provided on the front plate 102 of battery pack 100. Power cables (not shown) may be attached to the power connectors 104 and 106 and used to add or remove energy from the battery pack 100.

The front plate 102 of battery pack 100 may also include a status light and reset button 108. In one embodiment, status button 108 is a push button that can be depressed to reset or restart battery pack 100. In one embodiment, the outer ring around the center of button 108 may be illuminated to indicate the operating status of battery pack 100. The illumination may be generated by a light source, such as one or more light emitting diodes, that is coupled to or part of the status button 108. In this embodiment, different color illumination may indicate different operating states of the battery pack. For example, constant or steady green light may indicate that battery pack 100 is in a normal operating state; flashing or strobing green light may indicate that battery pack 100 is in a normal operating state and that battery pack 100 is currently balancing the batteries; constant or steady yellow light may indicate a warning or that battery pack 100 is in an error state; flashing or strobing yellow light may indicate a warning or that battery pack 100 is in an error state and that battery pack 100 is currently balancing the batteries; constant or steady red light may indicate that the battery pack 100 is in an alarm state; flashing or strobing red light may indicate that battery pack 100 needs to be replaced; and no light emitted from the status light may indicate that battery pack 100 has no power and/or needs to be replaced. In some embodiments, when the status light emits red light (steady or flashing) or no light, connectors in battery pack 100 or in an external controller are automatically opened to prevent charging or discharging of the batteries. As would be apparent to one of ordinary skill in the art, any color, strobing technique, etc., of illumination to indicate the operating status of battery pack 100 is within the scope of this disclosure.

Turning to FIG. 1C, example components that are disposed inside the housing of battery pack 100 are shown, including (but not limited to) balancing charger 132, battery pack controller (BPC) 134, and battery module controller (BMC) 138, Balancing charger 132 may be a power supply, such as a DC power supply, and may provide energy to all of the battery cells in a battery pack. BMC 138 is coupled to battery module 136 and may selectively discharge energy from the battery cells that are included in battery module 136, as well as take measurements (e.g., voltage and temperature) of battery module 136. BPC 134 may control balancing charger 132 and BMC 138 to balance or adjust the voltage and/or state of charge of a battery module to a target voltage and/or state of charge value.

As shown, battery pack 100 includes a plurality of battery modules and a BMC (e.g., battery module controller 138) is coupled to each battery module (e.g., battery module 136). In one embodiment, which is described in more detail below, n BMCs (where n is greater than or equal to 2) can be daisy-chained together and coupled to a BPC to form a single-wire communication network. In this example arrangement, each BMC may have a unique address and the BPC may communicate with each of the BMCs by addressing one or more messages to the unique address of any desired BMC. The one or more messages (which include the unique address of the BMC) may include an instruction to, for example, remove energy from a battery module, to stop removing energy from a battery module, to measure and report the temperature of the battery module, and to measure and report the voltage of the battery module. In one embodiment, BPC 134 may Obtain measurements (e.g., temperature, voltage) from each of the BMCs using a polling technique. BPC 134 may calculate or receive (e.g., from a controller outside of battery pack 100) a target voltage for battery pack 100, and may use the balancing charger 132 and the network of BMCs to adjust each of the battery modules to the target voltage. Thus, battery pack 100 may be considered a smart battery pack, able to self-adjust its battery cells to a target voltage.

The electrical wiring that connects various components of battery pack 100 has been omitted from FIG. 1C to enhance viewability. In the illustrated embodiment, balancing charger 132 and battery pack controller 134 may be connected to or mounted on the bottom 118. While shown as mounted on the left side of battery pack 100, balancing charger 132 and battery pack controller 134, as well as all other components disposed in battery pack 100, may be disposed at any location within battery pack 100.

Battery module 136 includes a plurality of battery cells. Any number of battery cells may be included in battery module 136. Example battery cells include, but are not limited to, Li ion battery cells, such as 18650 or 26650 battery cells. The battery cells may be cylindrical battery cells, prismatic battery cells, or pouch battery cells, to name a few examples. The battery cells or battery modules may be, for example, up to 100 AH battery cells or battery modules. :in some embodiments, the battery cells are connected in series/parallel configuration. Example battery cell configurations include, but are not limited to, 1P16S configuration, 2P16S configuration, 3P16S configuration, 4P16S configuration, 1P12S configuration, 2P12S configuration, 3P12S configuration, and 4P12S configuration. Other configurations known to one of ordinary skill in the art are within the scope of this disclosure. Battery module 136 includes positive and negative terminals for adding energy to and removing energy from the plurality of battery cells included therein.

As shown in FIG. 1C, battery pack 100 includes 12 battery modules that form a battery assembly. In another embodiment, battery pack 100 may include 16 battery modules that form a battery assembly. In other embodiments, battery pack 100 may include 20 battery modules or 25 battery modules that form a battery assembly. As would be apparent to one of ordinary skill in the art, any number of battery modules may be connected to form the battery assembly of battery pack 100. In battery pack 100, the battery modules that are arranged as a battery assembly may be arranged in a series configuration.

Figure 2:
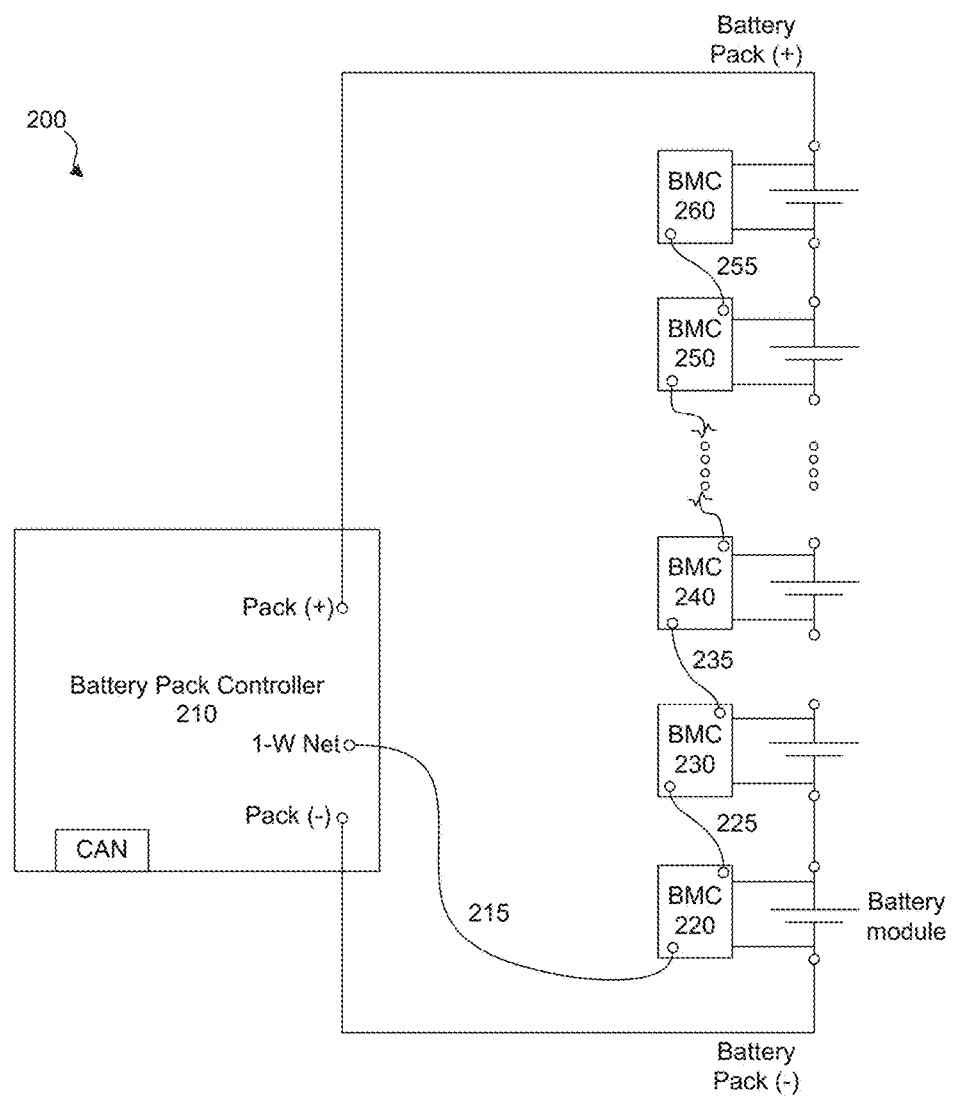
FIG. 2 is a diagram illustrating an example communication network formed by a battery pack controller and a plurality of battery module controllers.

In FIG. 1C, battery module controller 138 is coupled to battery module 136. Battery module controller 138 may be couple to the positive and negative terminals of battery module 136. Battery module controller 138 may be configured to perform one, some, or all of the following functions: remove energy from battery module 136, measure the voltage of battery module 136, and measure the temperature of battery module 136. As would be understood by one of ordinary skill in the art, battery module controller 138 is not limited to performing the functions just described. In one embodiment, battery module controller 138 is implemented as one or more circuits disposed on a printed circuit board. In battery pack 100, one battery module controller is coupled to or mounted on each of the battery modules in battery pack 100. Additionally, each battery module controller may be coupled to one or more adjacent battery module controllers via wiring to form a communication network. As illustrated in FIG. 2, n battery module controllers (where n is a whole number greater than or equal to two) may be daisy-chained together and coupled to a battery pack controller to form a communication network.

FIG. 2 is a diagram illustrating an example communication network 200 formed by a battery pack controller and a plurality of battery module controllers. In FIG. 2, battery pack controller (BPC) 210 is coupled to n battery module controllers (BMCs) 220, 230, 240, 250, and 260. Said another way, n battery module controllers (where n is a whole number greater than or equal to two) are daisy-chained together and coupled to battery pack controller 210 to form communication network 200, which may be referred to as a distributed, daisy-chained battery management system (BMS). Specifically, BPC 210 is coupled to BMC 220 via communication wire 215, BMC 220 is coupled to BMC 230 via communication wire 225, BMC 230 is coupled to BMC 240 via communication wire 235, and BMC 250 is coupled to BMC 260 via communication wire 255 to form the communication network. Each communication wire 215, 225, 235, and 255 may be a single wire, forming a single-wire communication network that allows the BCM 210 to communicate with each of the BCMs 220-260, and vice versa. As would be apparent to one of skill in the art, any number of BMCs may be daisy chained together in communication network 200.

Each BMC in the communication network 200 may have a unique address that BCP 210 uses to communicate with individual BMCs. For example, BMC 220 may have an address of 0002, BMC 230 may have an address of 0003, BMC 240 may have an address of 0004. BMC 350 may have an address of 0005, and BMC 360 may have an address of 0006. BPC 210 may communicate with each of the BMCs by addressing one or more messages to the unique address of any desired BMC. The one or more messages (which include the unique address of the BMC) may include an instruction to, for example, remove energy from a battery module, to stop removing energy from a battery module, to measure and report the temperature of the battery module, and to measure and report the voltage of the battery module. BPC 210 may poll the BMCs to obtain measurements related to the battery modules of the battery pack, such as voltage and temperature measurements. Any polling technique known to one of skill in the art may be used. In some embodiments, BPC 210 continuously polls the BMCs for measurements in order to continuously monitor the voltage and temperature of the battery modules in battery pack 100.

For example, BPC 210 may seek to communicate with BMC 240, e.g., in order to obtain temperature and voltage measurements of the battery module that BMC 240 is mounted on. In this example, BPC 210 generates and sends a message (or instruction) addressed to BMC 240 (e.g., address 0004). The other BMCs in the communication network 200 may decode the address of the message sent by BPC 210, but only the BMC (in this example, BMC 240) having the unique address of the message may respond. In this example, BMC 240 receives the message from BPC 210 (e.g., the message traverses communication wires 215, 225, and 235 to reach BMC 240), and generates and sends a response to BPC 210 via the single-wire communication network (e.g., the response traverses communication wires 235, 225, and 215 to reach BPC 210). BPC 210 may receive the response and instruct BMC 240 to perform a function (e.g., remove energy from the battery module it is mounted on). In other embodiments, other types of communication networks (other than communication network 200) may be used, such as, for example, an RS232 or RS485 communication network.

Figure 3:
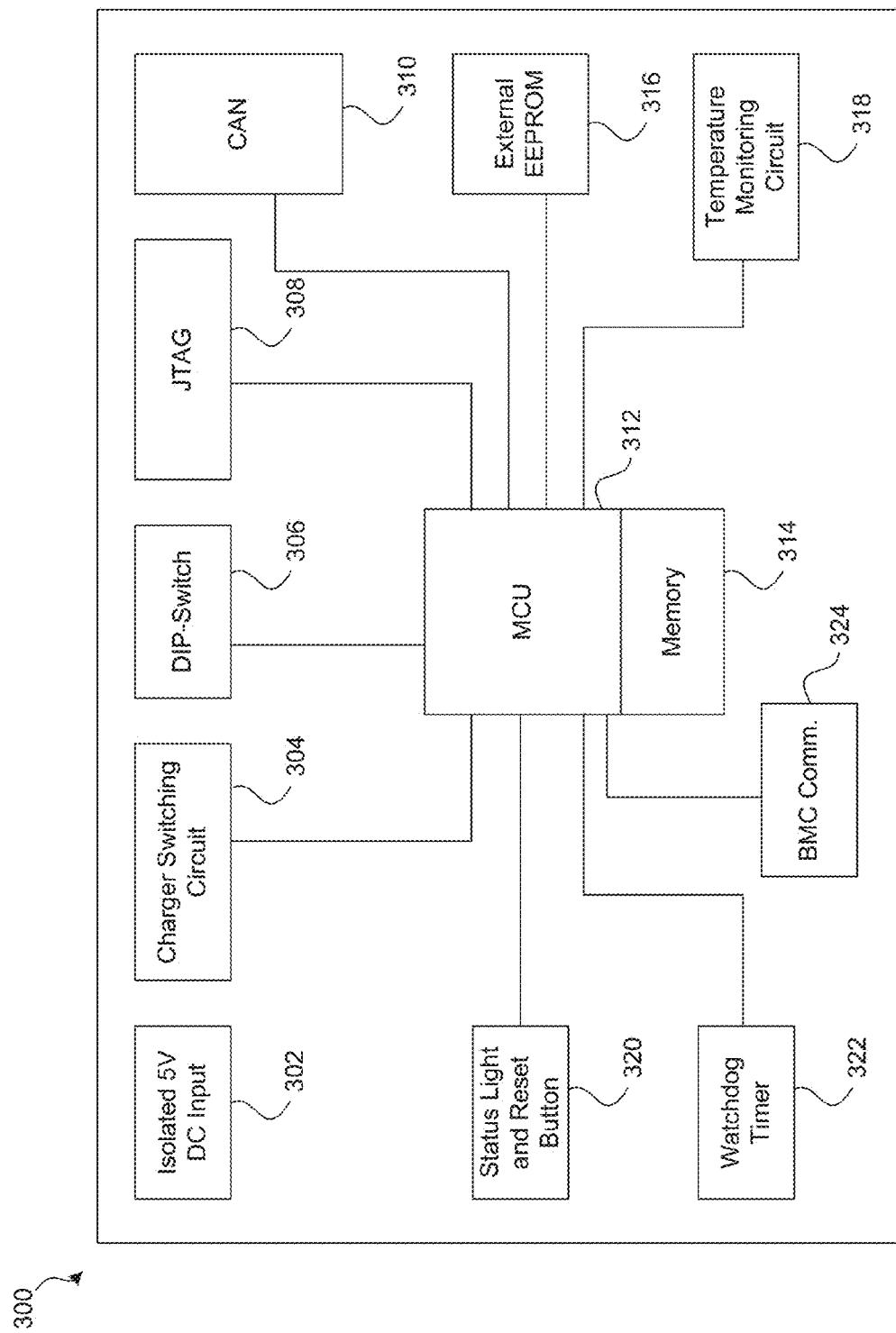
FIG. 3 is a diagram illustrating an example battery pack controller.

FIG. 3 is a diagram illustrating an example battery pack controller 300 according to an embodiment of the disclosure. Battery pack controller 134 of FIG. 1C may be implemented as described in accordance with battery pack controller 300 of FIG. 3. Battery pack controller 210 of FIG. 2 may be implemented as described in accordance with battery pack controller 300 of FIG. 3.

As shown in FIG. 3, the example battery pack controller 300 includes a DC input 302 (which may be an isolated 5V DC input), a charger switching circuit 304, a DIP-switch 306, a JTAG connection 308, a CAN (CAN Bus) connection 310, a microprocessor unit (MCU) 312, memory 314, an external EEPROM 316, a temperature monitoring circuit 318, a status light and reset button 320, a watchdog timer 322, and a battery module controller (BMC) communication connection 324.

In one embodiment, battery pack controller 300 may be powered from energy stored in the battery cells. Battery pack controller 300 may be connected to the battery cells by DC input 302. In other embodiments, battery pack controller 300 may be powered from an AC to DC power supply connected to DC input 302. In these embodiments, a DC-DC power supply may then convert the input DC power to one or more power levels appropriate for operating the various electrical components of battery pack controller 300.

In the example embodiment illustrated in FIG. 3, charger switching circuit 304 is coupled to MCU 312. Charger switching circuit 304 and MCU 312 may be used to control operation of a balancing charger, such as balancing charger 132 of FIG. 1C. As described above, a balancing charger may add energy to the battery cells of the battery pack. In an embodiment, temperature monitoring circuit 318 includes one or more temperature sensors that can monitor the temperature heat sources within the battery pack, such as the temperature of the balancing charger that is used to add energy to the battery cells of the battery pack.

Battery pack controller 300 may also include several interfaces and/or connectors for communicating. These interfaces and/or connectors may be coupled to MCU 312 as shown in FIG. 3. In one embodiment, these interfaces and/or connectors include: DIP-switch 306, which may be used to set a portion of software bits used to identify battery pack controller 300; JTAG connection 308, which may be used for testing and debugging battery pack controller 300; CAN (CANBus) connection 310, which may be used to communicate with a controller that is outside of battery pack 100; and BMC communication connection 324, which may be used to communicate with one or more battery module controllers, such as a distributed, daisy-chained network of battery module controllers (e.g., FIG. 2). For example, battery pack controller 300 may be coupled to a communication wire, e.g., communication wire 215 of FIG. 2, via BMC communication connection 324.

Battery pack controller 300 also includes an external EEPROM 316. External EEPROM 316 may store values, measurements, etc., for the battery pack. These values, measurements, etc., may persist when power of battery pack 100 is turned off (i.e., will not be lost due to loss of power). External EEPROM 316 may also store executable code or instructions, such as executable code or instructions to operate microprocessor unit 312.

Microprocessor unit (MCU) 312 is coupled to memory 314. MCU 312 is used to execute an application program that manages the battery pack. As described herein, in an embodiment the application program may perform the following functions (but is not limited thereto): monitor the voltage and temperature of the battery cells of battery pack 100, balance the battery cells of battery pack 100, monitor and control (if needed) the temperature of battery pack 100, handle communications between battery pack 100 and other components of an electrical energy storage system (see FIG. 5 below), and generate warnings and/or alarms, as well as take other appropriate actions, to protect the battery cells of battery pack 100.

As described above, a battery pack controller may obtain temperature and voltage measurements from battery module controllers. The temperature readings may be used to ensure that the battery cells are operated within their specified temperature limits and to adjust temperature related values calculated and/or used by the application program executing on MCU 312. Similarly, the voltage readings are used, for example, to ensure that the battery cells are operated within their specified voltage limits.

Watchdog timer 322 is used to monitor and ensure the proper operation of battery pack controller 300. In the event that an unrecoverable error or unintended infinite software loop should occur during operation of battery pack controller 300, watchdog timer 322 can reset battery pack controller 300 so that it resumes operating normally. Status light and reset button 320 may be used to manually reset operation of battery pack controller 300. As shown in FIG. 3, status tight and reset button 320 and watchdog timer 322 may be coupled to MCU 312.

Figure 4:
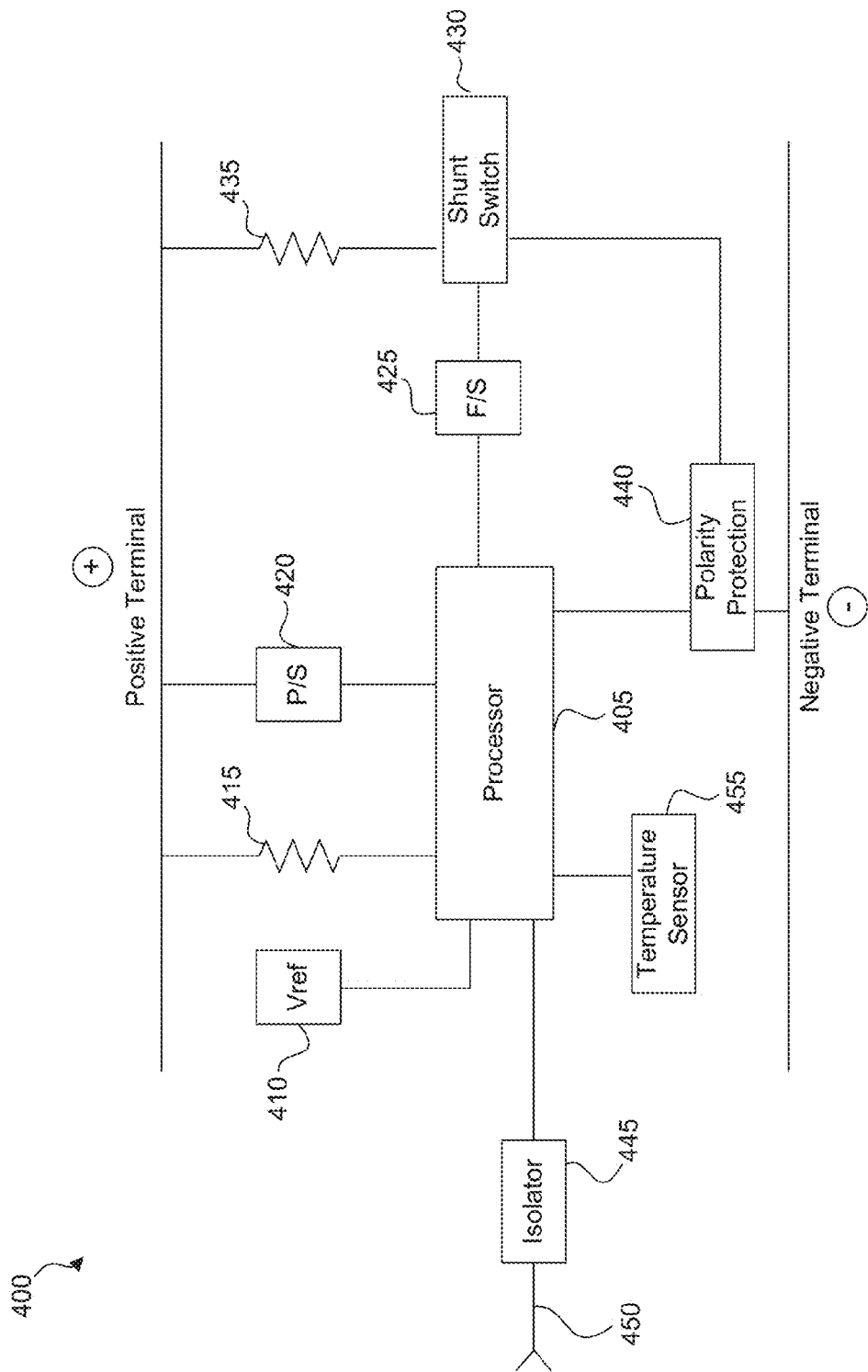
FIG. 4 is a diagram illustrating an example battery module controller.

FIG. 4 illustrates an example battery module controller 400 according to an embodiment of the disclosure. Battery module controller 138 of FIG. 1C may be implemented as described in accordance with battery module controller 400 of FIG. 4, Each of battery module controllers 220, 230, 240, 250, and 260 of FIG. 2 may be implemented as described in accordance with battery module controller 400 of FIG. 4. Battery module controller 400 may be mounted on a battery module of a battery pack and may perform the following functions (but is not limited thereto): measure the voltage of the battery module, measure the temperature of the battery module, and remove energy from (discharge) the battery module.

In FIG. 4, the battery module controller 400 includes processor 405, voltage reference 410, one or more voltage test resistors 415, power supply 420, fail safe circuit 425, shunt switch 430, one or more shunt resistors 435, polarity protection circuit 440, isolation circuit 445, and communication wire 450. Processor 405 controls the battery module controller 400. Processor 405 receives power from the battery module that battery module controller 400 is mounted on via the power supply 420. Power supply 420 may be a DC power supply. As shown in FIG. 4, power supply 420 is coupled to the positive terminal of the battery module, and provides power to processor 405. Processor 405 is also coupled to the negative terminal of the battery module via polarity protection circuit 440, which protects battery module controller 400 in the event that it is improperly mounted on a battery module (e.g., the components of battery module controller 400 that are coupled to the positive terminal in FIG. 4 are improperly coupled to the negative terminal and vice versa).

Battery module controller 400 may communicate with other components of a battery pack (e.g., a battery pack controller) via communication wire 450, which may be a single wire. As described with respect to the example communication network of FIG. 2, communication wire 450 may be used to daisy chain battery module controller 400 to a battery pack controller and/or one or more other battery module controllers to form a communication network. As such, battery module controller 400 may send and receive messages (including instructions sent from a battery pack controller) via communication wire 450. When functioning as part of a communication network, battery module controller 400 may be assigned a unique network address, which may be stored in a memory device of the processor 405.

Battery module controller 400 may be electrically isolated from other components that are coupled to the communication wire (e.g., battery pack controller, other battery module controllers) via isolation circuit 445. In FIG. 4, isolation circuit 445 is disposed between communication wire 450 and processor 405. Isolation circuit 445 may capacitively couple processor 405 to communication wire 450, or may provide other forms of electrical isolation known to those of skill in the art.

As explained above, battery module controller 400 may measure the voltage of the battery module it is mounted on. As shown in FIG. 4, processor 405 is coupled to voltage test resistor 415, which is coupled to the positive terminal of the battery module. Processor 405 may measure the voltage across voltage test resistor 415, and compare this measured voltage to voltage reference 410 to determine the voltage of the battery module. As described with respect to FIG. 2, battery module controller 400 may be instructed to measure the voltage of the battery module by a battery pack controller. After performing the voltage measurement, processor 405 may report the voltage measurement to a battery pack controller via communication wire 450.

Battery module controller 400 may also remove energy from the battery module that it is mounted on. As shown in FIG. 4, processor 405 is coupled to fail safe circuit 425, which is coupled to shunt switch 430. Shunt switch 430 is also coupled to the negative terminal via polarity protection circuit 440. Shunt resistor 435 is disposed between the positive terminal of the battery module and shunt switch 430. In this embodiment, when shunt switch 430 is open, shunt resistor 435 is not applied across the positive and negative terminals of the battery module; and when shunt switch 430 is closed, shunt resistor 435 is applied across the positive and negative terminals of the battery module in order to remove energy from the battery module. Processor 405 may instruct shunt switch 430 to selectively apply shunt resistor 435 across the positive and negative terminals of the battery module in order to remove energy from the battery module. In one embodiment, processor 405 instructs shunt switch 430 at regular intervals (e.g., once every 30 seconds) to apply shunt resistor 435 in order to continuously discharge the battery module.

Fail safe circuit 425 may prevent shunt switch 430 from removing too much energy from the battery module. In the event that processor 405 malfunctions, fail safe circuit 425 may instruct shunt switch 430 to stop applying shunt resistor 435 across the positive and negative terminals of the battery module. For example, processor 405 may instruct shunt switch 430 at regular intervals (e.g., once every 30 seconds) to apply shunt resistor 435 in order to continuously discharge the battery module. Fail safe circuit 425, which is disposed between processor 405 and shunt switch 430, may monitor the instructions processor 405 sends to shunt switch 430. In the event that processor 405 fails to send a scheduled instruction to the shunt switch 430 (which may be caused by a malfunction of processor 405) fails safe circuit 425 may instruct or cause shunt switch 430 to open, preventing further discharge of the battery module.

Battery module controller 400 of FIG. 4 also includes temperature sensor 455, which may measure the temperature of the battery module that battery module controller 400 is connected to. As depicted in FIG. 4, temperature sensor 455 is coupled to processor 405, and may provide temperature measurements to processor 405. Any temperature sensor known to those skilled in the art may be used to implement temperature sensor 455.

Figure 5:
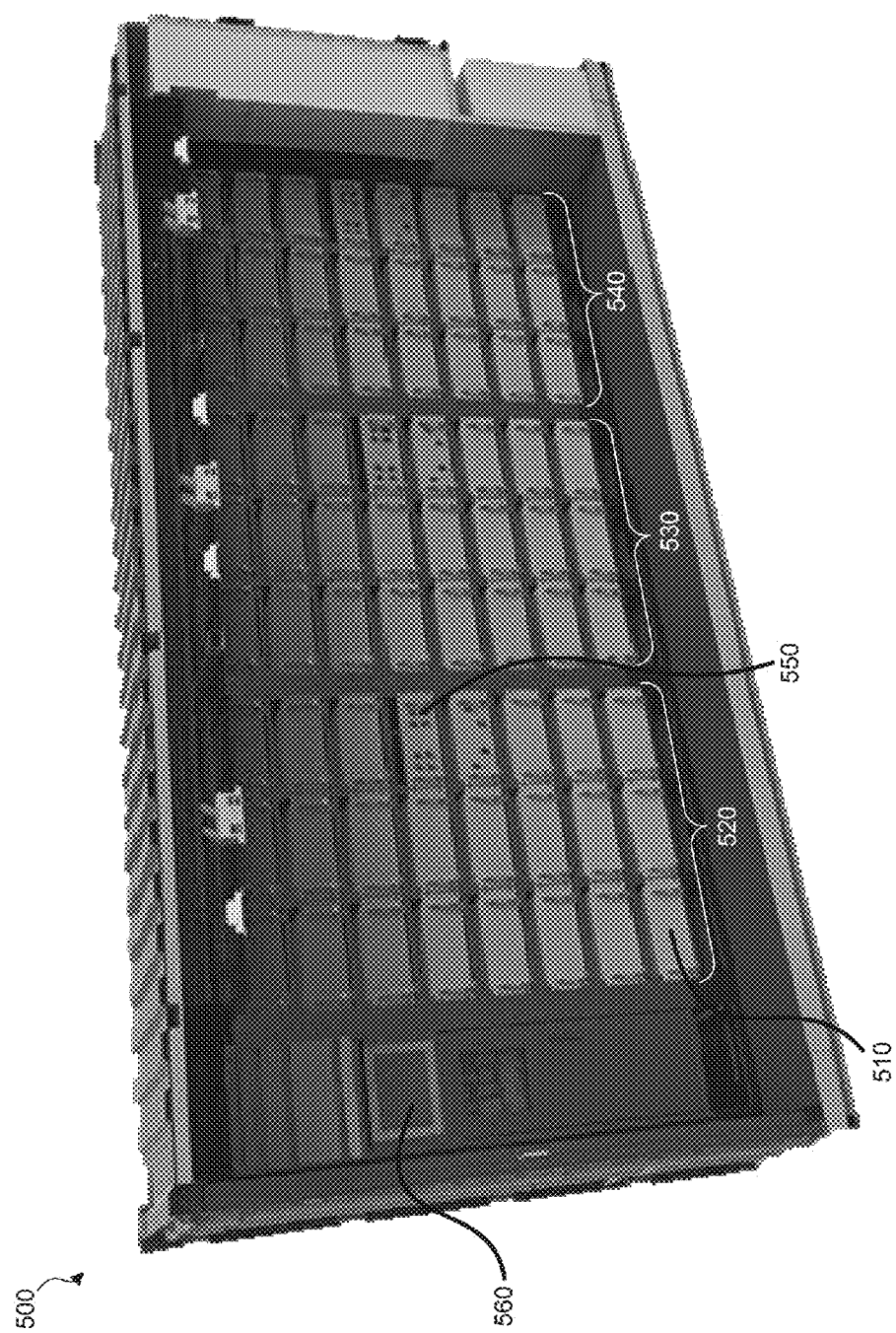
FIG. 5 is a diagram illustrating an example battery energy storage system.

FIG. 5 is a diagram that illustrates battery energy storage system 500. Battery energy storage system 500 can be operated as a stand-alone system, or it can be combined together with other battery energy storage. systems to form a part of a larger battery energy storage system. Battery energy storage system 500 may be highly scalable, ranging from a small kilowatt-hour size battery energy storage system to a megawatt-hour size battery energy storage system. In the embodiment illustrated in FIG. 5, battery energy storage system 500 is housed in a container (similar to a shipping container) and is movable (e.g., transported by a truck). Other housings known to those skilled in the art are within the scope of this disclosure.

As shown in FIG. 5, battery energy storage system 500 includes a plurality of battery packs, such as battery pack 510. Battery pack 510 may be implemented as described with respect to FIGS. 1-4 above. As explained above, each battery pack includes battery cells (which may be arranged into battery modules), a battery pack controller that monitors the battery cells, a balancing charger (e.g., DC power supply) that adds energy to each of the battery cells, and a distributed, daisy-chained network of battery module controllers that may take certain measurements of and remove energy from the battery cells, As explained, the battery pack controller may control the network of battery module controllers and the balancing charger to control the state-of-charge or voltage of a battery pack.

The battery packs of battery energy storage system 500 may be mounted on racks. A plurality of battery packs may be connected in series, which may be referred to as a string of battery packs or a battery pack string. For example, battery pack 510 may be connected in series with other battery packs to form battery pack string 520. FIG. 5 illustrates three battery pack strings 520, 530, and 540. A plurality of battery pack strings may be connected in parallel to form a battery energy storage system.

Each battery pack string may be controlled by a controller, which may be referred to as a string controller. For example, battery pack string 520 may be controlled by string controller 550. As its name suggests, a string controller may monitor and control the battery packs of a string. In an embodiment, the plurality of string controllers may be linked together using CAN (CANBus) communications, which enables the string controllers to operate together as part of an overall network of battery string controllers. This network of battery string controllers can manage and operate any size battery system such as, for example, a multi-megawatt-hour centralized battery energy storage system. In an embodiment, one of the networked battery string controllers (such as battery string controller 550) can be designated as a master battery string controller and used to control battery charge and discharge operations by sending commands that operate one or more inverters and/or chargers connected to the battery system. Alternatively, a computer or system controller 560 may be coupled to and control the string controllers in a battery energy storage system. A string controller may communicate with the battery pack controller in each of the battery packs in its string (e.g., string controller 550 may communicate with the BPC in battery pack 510) to monitor and control charging and discharging of the battery packs. In one embodiment, a string controller sends each battery pack in its string a target voltage, and the battery packs adjust the battery cells to the target voltage. A string controller and BPC may also communicate measurements (e.g., voltage, temperature, current values), and also perform diagnostic procedures, startup procedures, and the like.

In an embodiment battery energy storage system 500 includes or is otherwise coupled to a hi-directional power converter. The bi-directional power converter may charge and discharge battery packs using commands issued, for example, via a computer over a network (e.g. the Internet, an Ethernet, etc.). In one embodiment, an operator at a utility may use a networked computer to control battery energy storage system 500. Both the real power and the reactive power of the bi-directional power converter may be controlled. Also, in some embodiments, the bi-directional power converter can be operated as a backup power source when grid power is not available and/or the battery energy storage unit is disconnected from the power grid.

Battery energy storage system 500 may be used as a part of a renewable wind energy system, which includes wind turbines. Energy from the wind turbines may be stored in and selectively discharged from battery energy storage system 500. Similarly, battery energy storage system 500 may be used as a part of a renewable solar energy system, which includes a solar array. Energy from the solar array may be stored in and selectively discharged from the battery energy storage system 500. Additionally, battery energy storage system 500 may be used as a part of a grid energy system (power grid), which includes electrical equipment. Energy from grid energy system may be stored in and selectively discharged from battery energy storage system 500.

Cells of a battery pack, such as battery pack 100 of FIGS. 1A-C, may naturally lose a certain amount of energy over a period of time when not in use, which may be referred to as the self-discharge rate of the battery pack. In addition, a battery pack having a battery cell with a higher internal resistance than other battery cells may require more charging than other cells of the battery pack. In order to maintain battery cell balance, a balancing charger may operate periodically to charge the cells of the battery pack, compensating for the battery cells' self-discharge and different internal resistances. This periodic charging is desired in order to maintain the useful energy storage capacity of the battery pack. The self-discharge rate of different battery cells may vary based on battery cell impurities or other factors.

Figure 6:
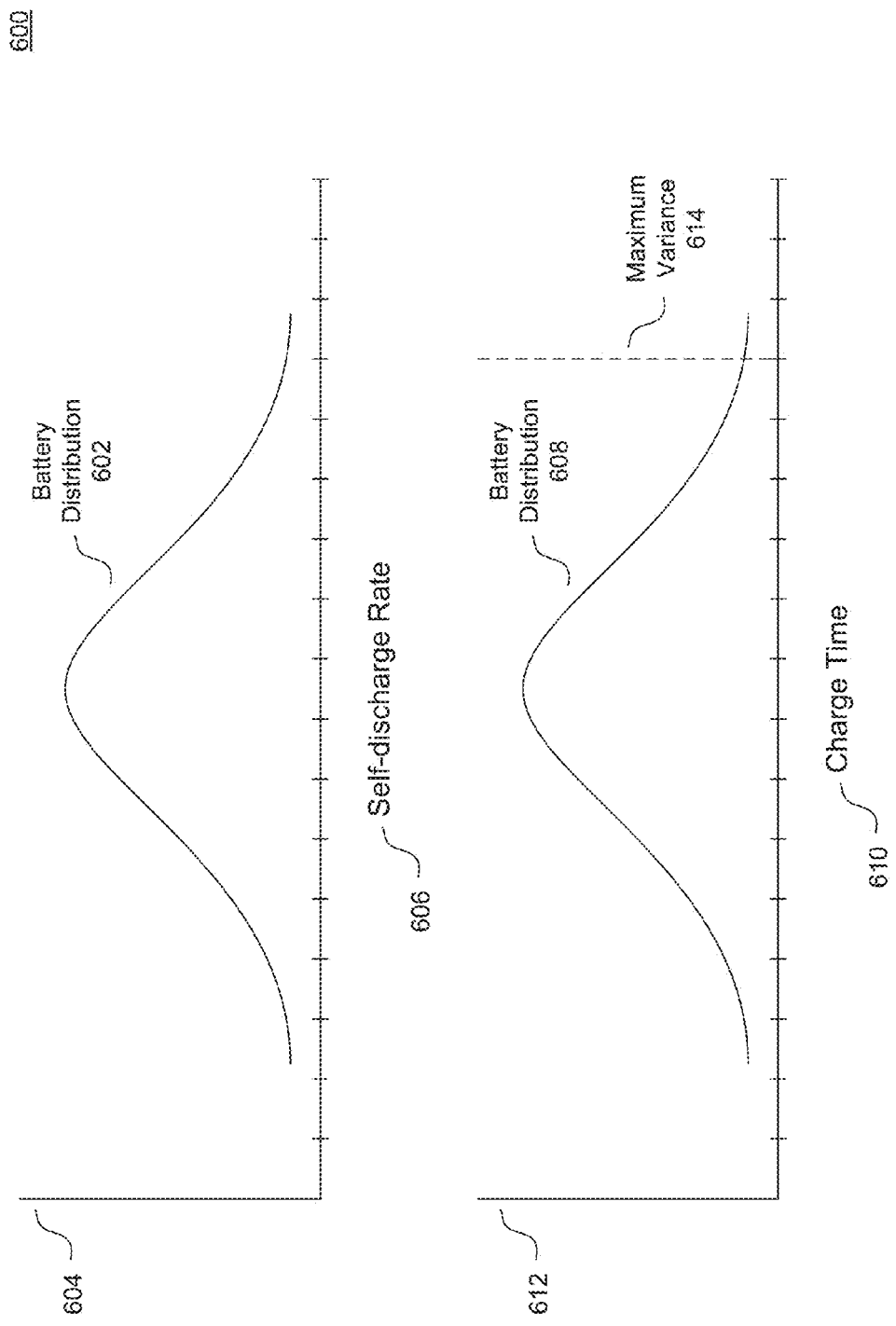
FIG. 6 is a diagram illustrating example distributions of battery packs based on self-discharge rates and charge times according to an embodiment.

FIG. 6 is a diagram illustrating example distributions of battery packs based, for example, on self-discharge rates and charge times, according to an embodiment. Plot 602 shows an example distribution of battery packs based on the self-discharge rate 606 of each battery pack over a period of time. Axis 604 indicates the number of battery packs having a particular self-discharge rate. Plot 602 indicates a normal distribution, with some battery packs having higher or lower self-discharge.

Plot 608 shows an analogous distribution of battery packs based on the charge time 610 of each battery pack. In an embodiment, a timer may track the operating time of a balancing charger, such as balancing charger 132 of FIG. 1C, to determine the charge time of a battery pack during a period of time. Axis 612 indicates the number of battery packs having similar charge times during a period of time.

As illustrated in FIG. 6, the self-discharge rate and charge time of a battery pack are expected to be similar. In an embodiment, data may be gathered for a plurality of battery packs during a period of time in order to determine battery distributions 602 and 608. The mean charge time of the plurality of battery packs may provide a reliable indication of the expected charge time for a healthy battery pack, e.g., a battery pack that is operating within accepted tolerances. From these distributions, a maximum expected variance 614 above the mean charge time may be chosen. For example, maximum variance 614 may be set to two standard deviations from the mean charge time of the plurality of battery packs. In an embodiment, a charge time that exceeds maximum variance 614 may indicate a battery pack having an operating issue or defect. One of skill in the art will recognize that maximum variance 614 may be any value above the expected charge time of a battery pack and may be static or updated dynamically as additional data is gathered.

Figure 7:
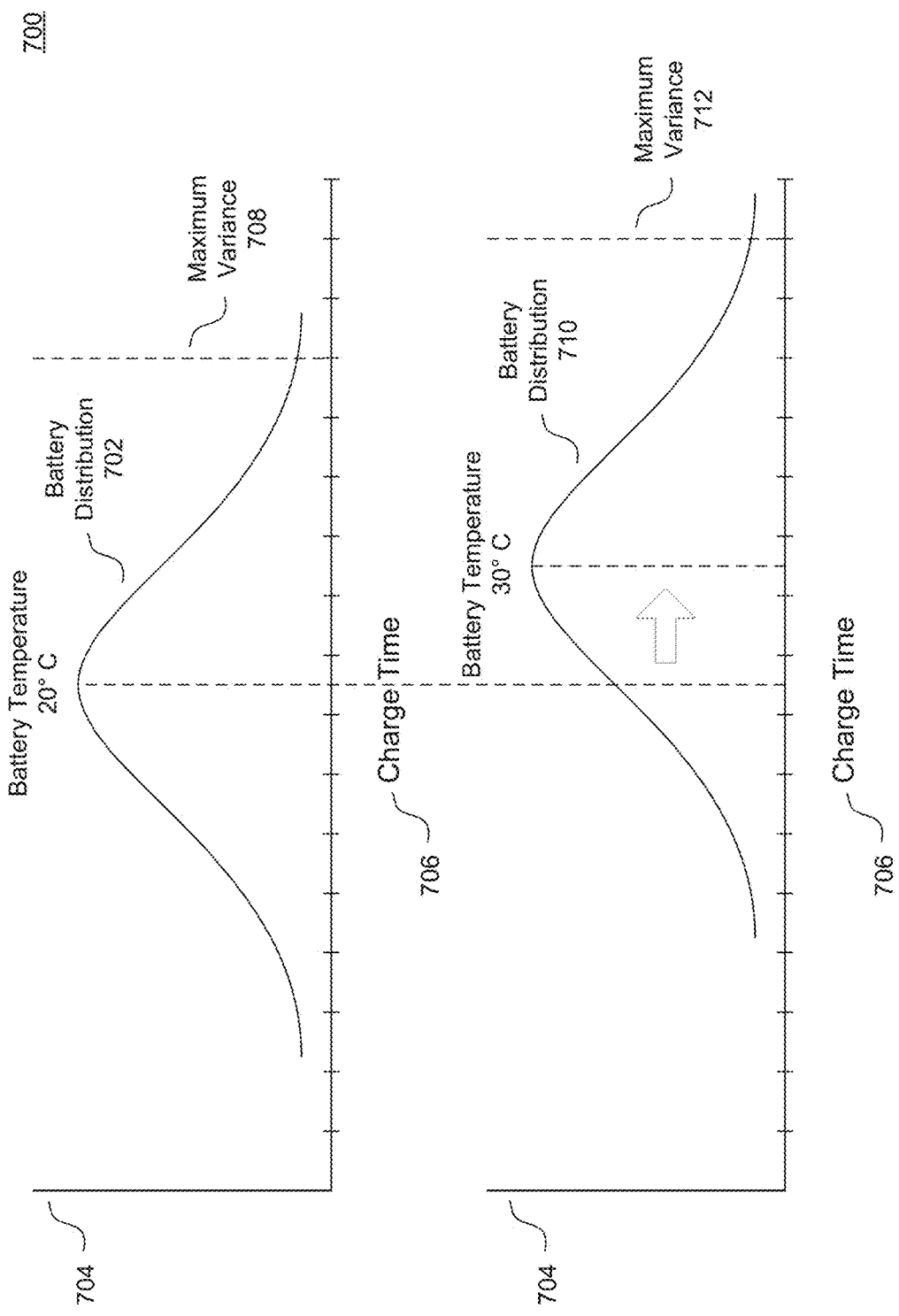
FIG. 7 is a diagram illustrating correlation between temperature and charge time of a battery pack according to an embodiment.

FIG. 7 is a diagram illustrating correlation between temperature and charge time of a battery pack, according to an embodiment. Plot 702 shows an example distribution of battery packs based on the charge time 706 of each battery pack. Axis 704 indicates the number of battery packs having similar charge times during a period of time. As illustrated in FIG. 7, plot 702 represents the battery distribution based on a consistent battery temperature of 20° C. for each of the battery packs. In an embodiment, the battery temperature may be, for example, an average temperature of each battery cell or each battery module contained within a battery pack.

Temperature has a significant effect on the performance of a battery pack. For example, higher temperatures may increase the rate of self-discharge of a battery. In a non-limiting example, a battery pack may self-discharge 2% per month at a constant 20° C. and increase to 10% per month at a constant 30° C. Plot 710 shows the distribution of battery packs based on charge time 706 with each battery pack having a temperature of 30° C. At 30° C., the charge times of each battery pack maintain a normal distribution, but the mean and expected charge time is shifted.

Because of distribution shifts at different temperatures, maximum variance 708 may be updated to compensate for temperature fluctuations. In an embodiment, one or more temperature sensors may monitor the average battery cell or battery module temperature of a battery pack. The temperature sensors may be internal or external to the battery pack. Maximum variance 708 may then be adjusted dynamically in response to temperature changes. For example, if the average battery module temperature of a battery pack is determined to be 30° C., the maximum expected variance may be adjusted to maximum variance 712. This may prevent replacement of healthy battery packs, for example, when charge time of a battery pack falls between maximum variance 708 and maximum variance 712 at a temperature of 30° C. In other embodiments, environmental temperature may be monitored instead of or in combination with battery module temperatures, and maximum variance 708 may be adjusted dynamically in response to environmental temperature changes.

Figure 8:
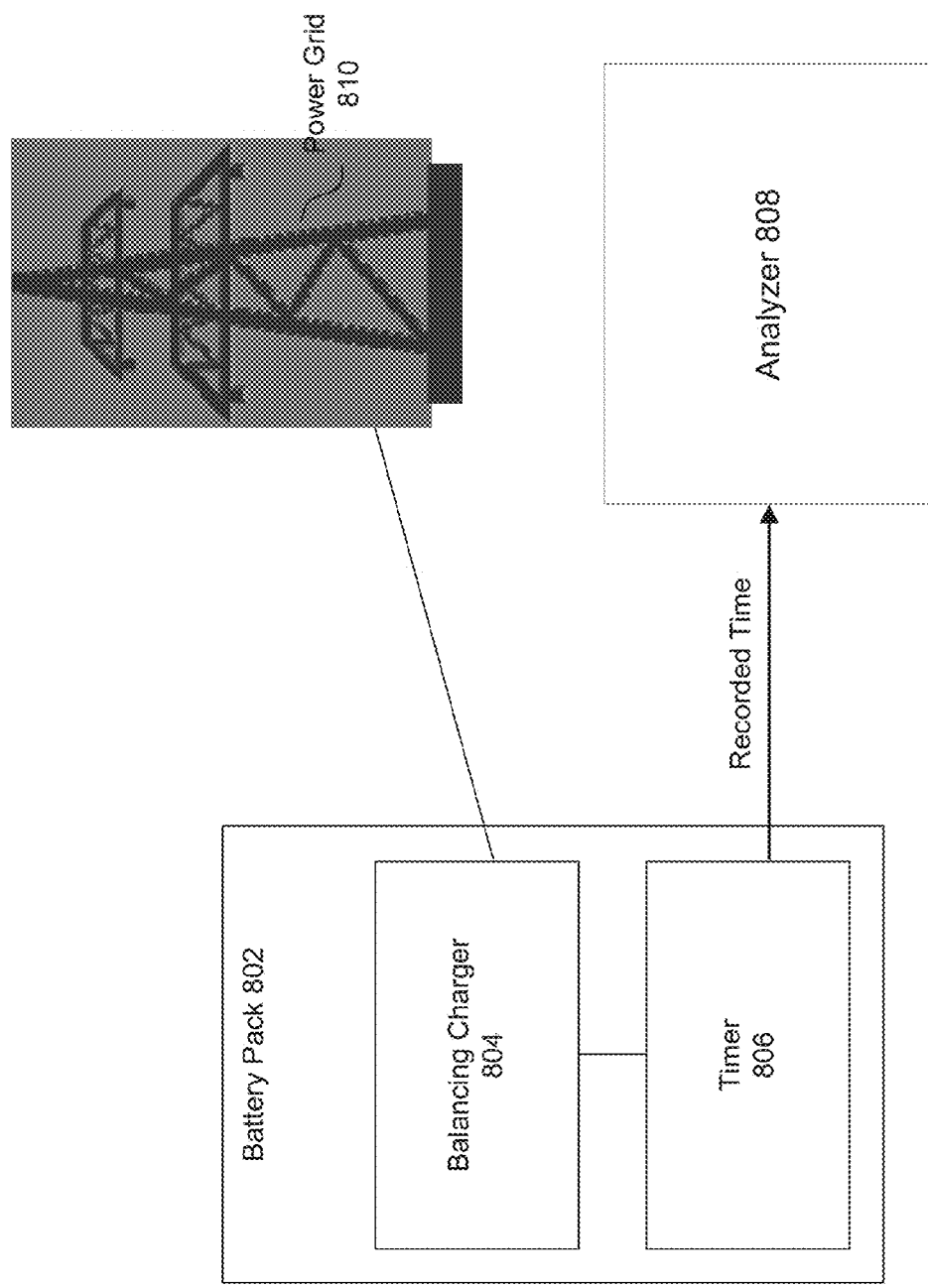
FIG. 8 is a diagram illustrating an example system for detecting a battery pack having an operating issue or defect according to an embodiment.

FIG. 8 is a diagram illustrating an example system for detecting a battery pack having an operating issue or defect, according to an embodiment. In an embodiment, system 800 includes a battery pack 802 and an analyzer 808. Battery pack 802 may include a balancing charger 804, such as balancing charger 1132 of FIG. 1C, and a timer 806. Battery pack 802 may be coupled to an electrical power grid 810. This enables balancing charger 804 to be turned on and off when appropriate to charge the cells of battery pack 802.

In an embodiment, timer 806 records the amount of time that balancing charger 804 is operating. Timer 806 may be embedded in the battery pack as part of a battery pack controller, such as battery pack controller 300 of FIG. 3. Alternatively, timer 806 may be separate from the battery pack controller. In an embodiment, timer 806 may be reset after a certain period of time or at particular intervals of time. For example, timer 806 may be reset on the first of each month in order to record the amount of time balancing charger 804 operates during the month. Alternatively, timer 806 may maintain a cumulative operating time or the time the charger operated during a specified period of time, for example, the last 30 days.

In an embodiment, timer 806 may periodically send recorded operating times to analyzer 808, In an embodiment, analyzer 808 may be a part of battery pack 802. For example, analyzer 808 may be integrated into a battery pack controller of battery pack 802, such as battery pack controller 300 of FIG. 3. In other embodiments, analyzer 808 may be external to battery pack 802 and may be implemented on any computing system as described in FIG. 9. In an embodiment where battery pack 802 is part of an electrical storage unit, such as electrical storage unit 500 of FIG. 5, analyzer 808 may be part of a string controller or system controller as described with respect to FIG. 5.

In an embodiment, analyzer 808 may select a time period and compare recorded operating times for the selected time period to a threshold time. The threshold time may indicate a maximum determined variance from the expected operating time of balancing charger 806. The expected operating time may represent the expected charge time of the battery pack for the selected time period, taking into account factors such as, but not limited to, battery usage and self-discharge rate. Analyzer 808 may set expected operating times and threshold times based on statistical analysis of data collected from a plurality of battery packs and may be adjusted as additional data is collected. If battery pack 802 is part of an array of battery packs, expected and threshold operating times may be determined based on analysis of all or a subset of battery packs in the array. Additionally, in an embodiment, the threshold time may be dynamically adjusted based on the average battery cell or battery module temperature of the battery back or the environmental temperature surrounding the battery pack, as described with respect to FIG. 7. In an embodiment, one or more temperature sensors may monitor the battery pack temperature or environmental temperature and provide measurements to analyzer 808. Analyzer 808 may then use the received temperature measurements to adjust the threshold time.

In an embodiment, if the recorded operating time exceeds the threshold time, analyzer 808 may determine that the battery pack has an operating issue or defect and may require maintenance and/or replacement in this case, analyzer 808 may issue an alert to an appropriate party, such as an operator responsible for monitoring the battery pack. In an embodiment, the alert may be issued as an email or other electronic communication. In other embodiments, the issued alert may be audial or visual, for example a flashing red light on the battery pack, such as the warnings described above with respect to status button 108 of FIGS. 1A and 1B.

In an embodiment, analyzer 808 may also halt operation of the battery pack in response to determining that the battery pack has an operating issue or defect. This may act as a mechanism to preclude any adverse effects that may occur from operating a battery pack having an operating issue or defect.

Figure 9:
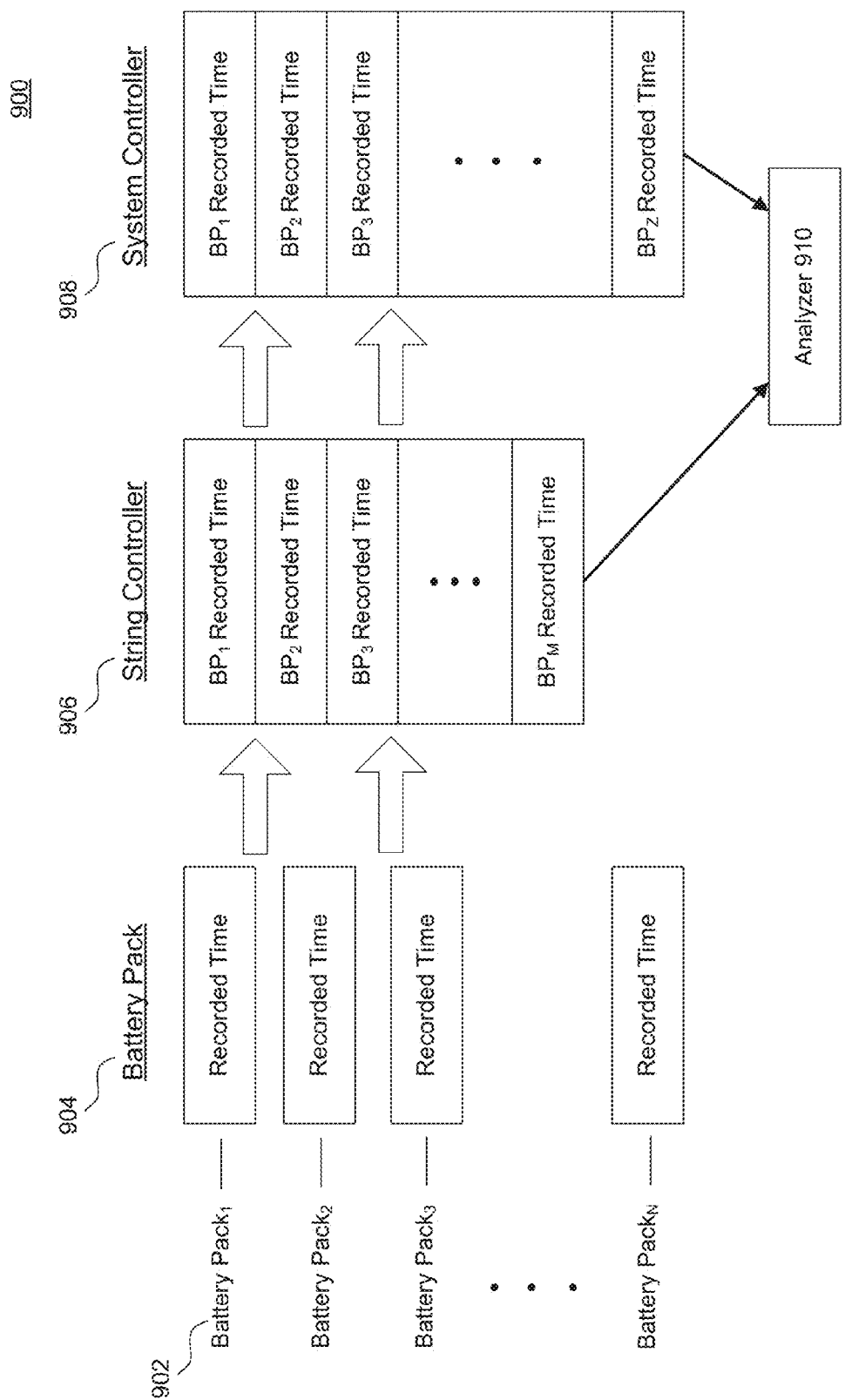
FIG. 9 is a diagram illustrating aggregation of data for analysis from an array of battery packs according to an embodiment.

FIG. 9 is a diagram illustrating aggregation of data for analysis from an array of battery packs, according to an embodiment. In an embodiment, an energy system, such as electrical storage unit 500 of FIG. 5, comprises a plurality of battery packs 902. Each battery pack 902 may include a timer to record the amount of time that the battery pack is charging. The recorded times may be stored in each battery pack, as shown at 904. In an embodiment, each timer may be integrated into a battery pack controller of each battery pack, such as battery pack controller 300 of FIG. 3, comprising a processor and a memory to store the recorded time.

In an embodiment, recorded times for each battery pack may be aggregated by one or more string controllers, such as string controller 550 of FIG. 5, as indicated at 906, and/or by a system controller, such as system controller 560 of FIG. 5, as indicated at 908. As illustrated in FIG. 9, each string controller may manage a subset of the plurality of battery packs.

In an embodiment, the aggregated recorded times may be sent by the one or more string controllers or the system controller to one or more analyzers 910, such as analyzer 808 of FIG. 8. Analyzer 910 may collect various data about the plurality of battery packs in an effort to detect and identify battery packs having an operating issue or defect, as described with respect to FIG. 8. In an embodiment, an analyzer 910 may be part of each string controller and/or the system controller. In this manner, analysis may be localized based on groupings of battery packs, or conducted for an entire system. In an embodiment, analyzer 910 may be external to the plurality of battery packs, string controllers, and system controller.

Figure 10:
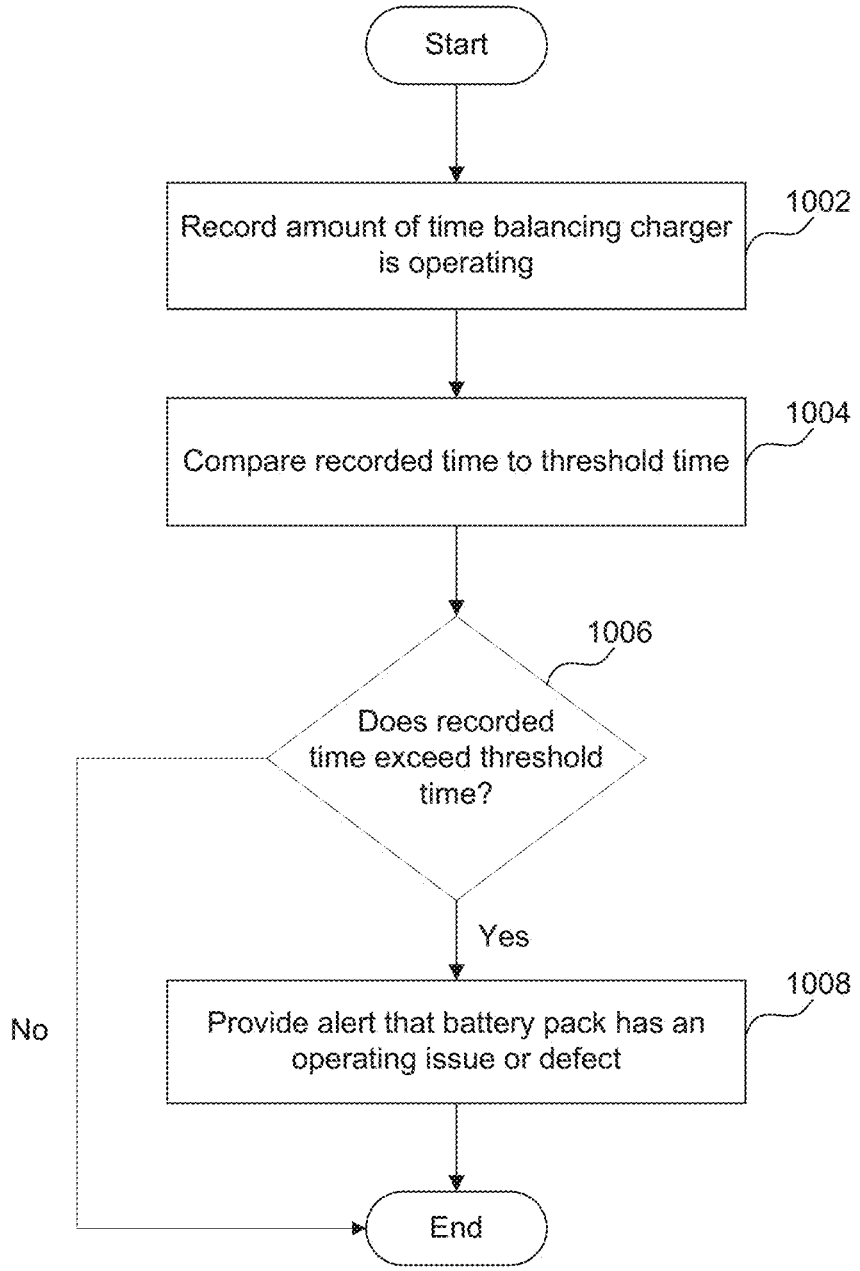
FIG. 10 is a flowchart illustrating an example method for detecting a battery pack having an operating issue or defect according to an embodiment.

FIG. 10 is a flowchart illustrating an example method for detecting a battery pack having an operating issue or defect according to an embodiment. Each stage of the example method may represent a computer-readable instruction stored on a computer-readable storage device, which when executed by a processor causes the processor to perform one or more operations.

Method 1000 begins at stage 1002 by recording the amount of time that a balancing charger is operating. The balancing charger may be part of the battery pack, such as balancing charger 132 of FIG. 1C, and configured to charge the cells of the battery pack.

At stage 1004, the recorded operating time for a particular time period is compared to a threshold time. The threshold time may indicate a maximum determined variance from the expected operating time of the balancing charger. The expected operating time may represent the expected charge time of the battery pack for the time period, taking into account factors such as, but not limited to, battery usage and self-discharge rate.

At stage 1006, it is determined whether the recorded operating time exceeds the threshold time. This may indicate that the battery pack is charging longer than expected and may require maintenance and/or replacement. At stage 1008, if the recorded operating time exceeds the threshold time, an alert may be provided to an appropriate party, such as an operator responsible for monitoring the battery pack. In an embodiment, the alert may be issued as an email or other electronic communication. In other embodiments, the issued alert may be audial or visual, for example a red light on the battery pack. Returning to stage 1006, if the recorded operating time does not exceed the threshold time, the method ends.

Figure 11:
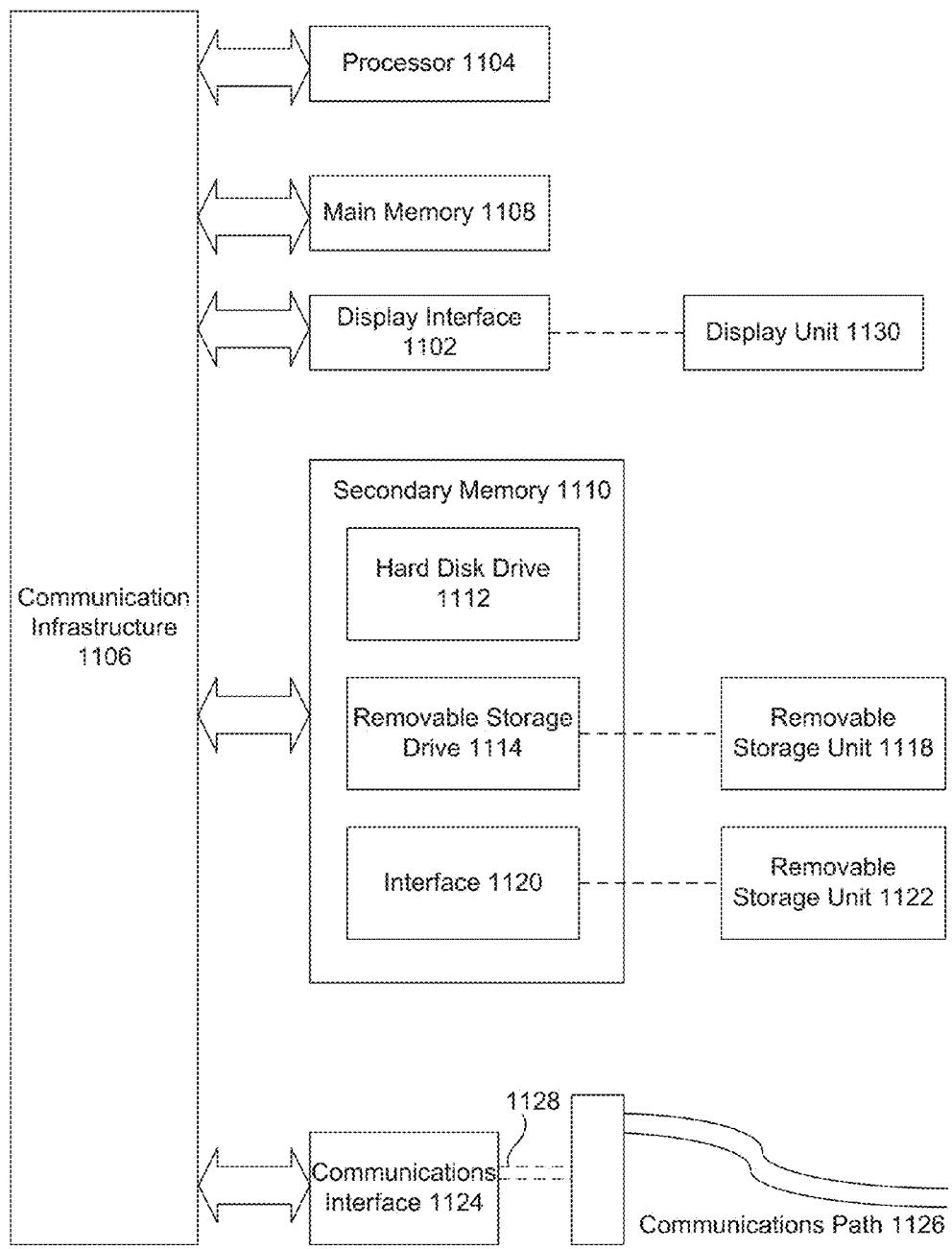
FIG. 11 is a diagram illustrating an example computing system according to an embodiment.

FIG. 11 is an example computing system that may be useful for implementing various embodiments or certain components of various embodiments. Various embodiments can be implemented, for example, using one or more well-known computer systems, such as computer system 1100. Computer system 1100 can be any well-known computer capable of performing the functions described herein, such as computers available from International Business Machines, Apple, Sun, HP, Dell, Sony, Toshiba, etc.

Computer system 1100 includes one or more processors (also called central processing units, or CPUs), such as a processor 1104. Processor 1104 may be connected to a communication infrastructure or bus 1106.

One or more processors 1104 may each be a graphics processing unit (GPU). In an embodiment a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 1100 also includes user input/output device(s) 1103, such as monitors, keyboards, pointing devices, etc., which communicate with communication infrastructure 1106 through user input/output interface(s) 1102.

Computer system 1100 also includes a main or primary memory 1108, such as random access memory (RAM). Main memory 1108 may include one or more levels of cache. Main memory 1108 has stored therein control logic (i.e., computer software) and/or data.

Computer system 1100 may also include one or more secondary storage devices or memory 1110. Secondary memory 1110 may include, for example, a hard disk drive 1112 and/or a removable storage device or drive 1114. Removable storage drive 1114 may be a floppy disk drive, a magnetic tape drive, a compact disk drive, an optical storage device, tape backup device, and/or any other storage device/drive.

Removable storage drive 1114 may interact with a removable storage unit 1118. Removable storage unit 1118 includes a computer usable or readable storage device having stored thereon computer software (control logic) and/or data. Removable storage unit 1118 may be a floppy disk, magnetic tape, compact disk, DVD, optical storage disk, and/or any other computer data storage device. Removable storage drive 1114 reads from and/or writes to removable storage unit 1118 in a well-known manner.

According to an exemplary embodiment, secondary memory 1110 may include other means, instrumentalities or other approaches for allowing computer programs and/or other instructions and/or data to be accessed by computer system 1100. Such means, instrumentalities or other approaches may include, for example, a removable storage unit 1122 and an interface 1120. Examples of the removable storage unit 1122 and the interface 1120 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1100 may further include a communication or network interface 1124. Communication interface 1124 enables computer system 1100 to communicate and interact with any combination of remote devices, remote networks, remote entities, etc. (individually and collectively referenced by reference number 1128). For example, communication interface 1124 may allow computer system 1100 to communicate with remote devices 1128 over communications path 1126, which may be wired and/or wireless, and which may include any combination of LANs, WANs, the Internet, etc. Control logic and/or data may be transmitted to and from computer system 1100 via communication path 1126.

In an embodiment, a tangible apparatus or article of manufacture comprising a tangible computer useable or readable medium having control logic (software) stored thereon is also referred to herein as a computer program product or program storage device. This includes, but is not limited to, computer system 1100, main memory 1108, secondary memory 1110, and removable storage units 1118 and 1122, as well as tangible articles of manufacture embodying any combination of the foregoing. Such control logic, when executed by one or more data processing devices (such as computer system 1100), causes such data processing devices to operate as described herein.

Based on the teachings contained in this disclosure, it will be apparent to persons skilled in the relevant art(s) how to make and use the inventions using data processing devices, computer systems and/or computer architectures other than that shown in FIG. 11. In particular, embodiments may operate with software, hardware, and/or operating system implementations other than those described herein.

Software described throughout this disclosure may be embodied as one or more computer-readable instruction(s) on a computer-readable storage device that is tangible—such as a persistent memory device (e.g., read-only memory (ROM), flash memory, a magnetic storage device, an optical disc, and the like), a non-persistent memory device (e.g., random-access memory (RAM)), and the like—that can be executed by a processor to perform one or more operations.

Embodiments of the present inventions have been described above with the aid of functional building blocks illustrating the implementation of specified functions and relationships thereof. The boundaries of these functional building blocks have been arbitrarily defined herein for the convenience of the description. Alternate boundaries can be defined so tong as the specified functions and relationships thereof are appropriately performed. Also, Identifiers, such as "(a)," "(b)," "(i)," "(ii)," etc., are sometimes used for different elements or steps. These identifiers are used fur clarity and do not necessarily designate an order for the elements or steps.

The foregoing description of specific embodiments will so fully reveal the general nature of the inventions that others can, by applying knowledge within the skill of the art, readily modify and/or adapt for various applications such specific embodiments, without undue experimentation, without departing from the general concept of the present inventions. Therefore, such adaptations and modifications are intended to be within the meaning and range of equivalents of the disclosed embodiments, based on the teaching and guidance presented herein. It is to be understood that the phraseology or terminology herein is fur the purpose of description and not of limitation, such that the terminology or phraseology of the present specification is to be interpreted by the skilled artisan in light of the teachings and guidance.

The breadth and scope of the present inventions should not be limited by any of the above-described embodiments, but should be defined only in accordance with the following claims and their equivalents.

What is claimed is:

1. A system for detecting a battery pack having an operating issue or defect, comprising:
    a battery pack controller implemented in the battery pack;
    a system controller coupled to the battery pack controller and configured to set an expected operating time of the battery pack based on a mean charge time of a plurality of battery packs;
    a balancing charger coupled to the battery pack controller and configured to charge a battery pack;
    a timer, implemented on the battery pack controller, configured to record an amount of time that the balancing charger is operating;
    an analyzer, implemented on the system controller, configured to:
        receive the recorded amount of time from the battery pack controller;
        compare the recorded amount of time to a threshold time, the threshold time indicating a determined variance from the expected operating time; and
        determine that the battery pack requires maintenance when the recorded amount of time exceeds the threshold time.

2. The system of claim 1, wherein the analyzer is further configured to issue an alert in response to determining that the battery pack requires maintenance.

3. The system of claim 1, wherein the analyzer is further configured to halt operation of the battery pack in response to determining that the battery pack requires maintenance.

4. The system of claim 1, wherein the timer is further configured to record the amount of time that the balancing charger is operating within a fixed period of time.

5. The system of claim 1, wherein the timer is further configured to reset the recorded amount of time in response to exceeding a time-based threshold.

6. The system of claim 1, wherein the analyzer is further configured to adjust the threshold time based on an average battery cell temperature of the battery pack.

7. A method of detecting a battery pack having an operating issue or defect, comprising:
    recording, by a timer implemented on a battery pack controller within the battery pack, an amount of time that a balancing charger is operating, the balancing charger coupled to the battery pack controller and configured to charge the battery pack;
    setting, by a system controller, an expected operating time of the battery pack based on a mean charge time of a plurality of battery packs, wherein the system controller is coupled to the battery pack controller;
    receiving, by an analyzer implemented on the system controller, the recorded amount of time from the battery pack controller;
    comparing, by the analyzer, the recorded amount of time to a threshold time, the threshold time indicating a determined variance from the expected operating time; and
    determining, by the analyzer, that the battery pack requires maintenance in response to the recorded amount of time exceeding the threshold time.

8. The method of claim 7, further comprising issuing an alert in response to determining that the battery pack requires maintenance.

9. The method of claim 7, further comprising halting operation of the battery pack in response to determining that the battery pack requires maintenance.

10. The method of claim 7, wherein the recording occurs within a fixed period of time.

11. The method of claim 7, further comprising resetting the recorded amount of time in response to exceeding a time-based threshold.

12. The method of claim 7, further comprising adjusting the threshold time based on an average battery cell temperature of the battery pack.

13. A non-transitory computer-readable storage device having instructions stored thereon that, when executed by at least one computing device, cause the at least one computing device to perform operations comprising:

recording, by a timer implemented on a battery pack controller within a battery pack, an amount of time that a balancing charger is operating, the balancing charger coupled to the battery pack controller and configured to charge the battery pack;

setting, by a system controller, an expected operating time of the battery pack based on a mean charge time of a plurality of battery packs, wherein the system controller is coupled to the battery pack controller;

receiving, by an analyzer implemented on the system controller, the recorded amount of time from the battery pack controller;

comparing, by the analyzer, the recorded amount of time to a threshold time, the threshold time indicating a determined variance from the expected operating time; and determining, by the analyzer, that the battery pack requires maintenance in response to the recorded amount of time exceeding the threshold time.

14. The computer-readable storage device of claim 13, the operations further comprising issuing an alert in response to determining that the battery pack requires maintenance.

15. The computer-readable storage device of claim 13, the operations further comprising halting operation of the battery pack in response to determining that the battery pack requires maintenance.

16. The computer-readable storage device of claim 13, wherein the recording occurs within a fixed period of time.

17. The computer-readable storage device of claim 13, the operations further comprising resetting the recorded amount of time in response to exceeding a time-based threshold.

18. The computer-readable storage device of claim 13, the operations further comprising adjusting the threshold time based on an average battery cell temperature of the battery pack.

* * * * *